United States Patent
Ochii

[11] Patent Number: 5,157,474
[45] Date of Patent: Oct. 20, 1992

[54] STATIC MEMORY

[75] Inventor: Kiyofumi Ochii, Yokohama, Japan

[73] Assignee: Kabushiki Kaishi Toshiba, Kawasaki, Japan

[21] Appl. No.: 506,830

[22] Filed: Apr. 10, 1990

[30] Foreign Application Priority Data

Apr. 14, 1989 [JP] Japan .................................. 1-94871

[51] Int. Cl.$^5$ ..................... H01L 27/02; H01L 27/01; H01L 27/12; G11C 11/34
[52] U.S. Cl. ......................................... 357/41; 357/42; 357/23.7; 357/4; 365/154; 365/182
[58] Field of Search ....................... 357/41, 42, 23.7, 4, 357/59, 23.15; 365/154, 174, 181, 182

[56] References Cited

U.S. PATENT DOCUMENTS 4,633,438 12/1986 Kume et al. ................... 357/23.7
4,920,391 4/1990 Uchida ............................ 357/23.4

OTHER PUBLICATIONS

IBM Technical Disclosure Bulletin, vol. 18, #12, pp. 3947–3948, May 1976 by Garnache.

Primary Examiner—Mark V. Prenty
Attorney, Agent, or Firm—Banner, Birch, McKie & Beckett

[57] ABSTRACT

A static memory in which polysilicon thin film transistors serve as load elements in a memory cell, and the gate electrodes of the polysilicon thin film transistors are formed of diffusion regions. In the static memory, high quality uniform TFTS are formed, and the oxidation films of the TFTs can be thin, without using a complex manufacturing technique.

4 Claims, 5 Drawing Sheets

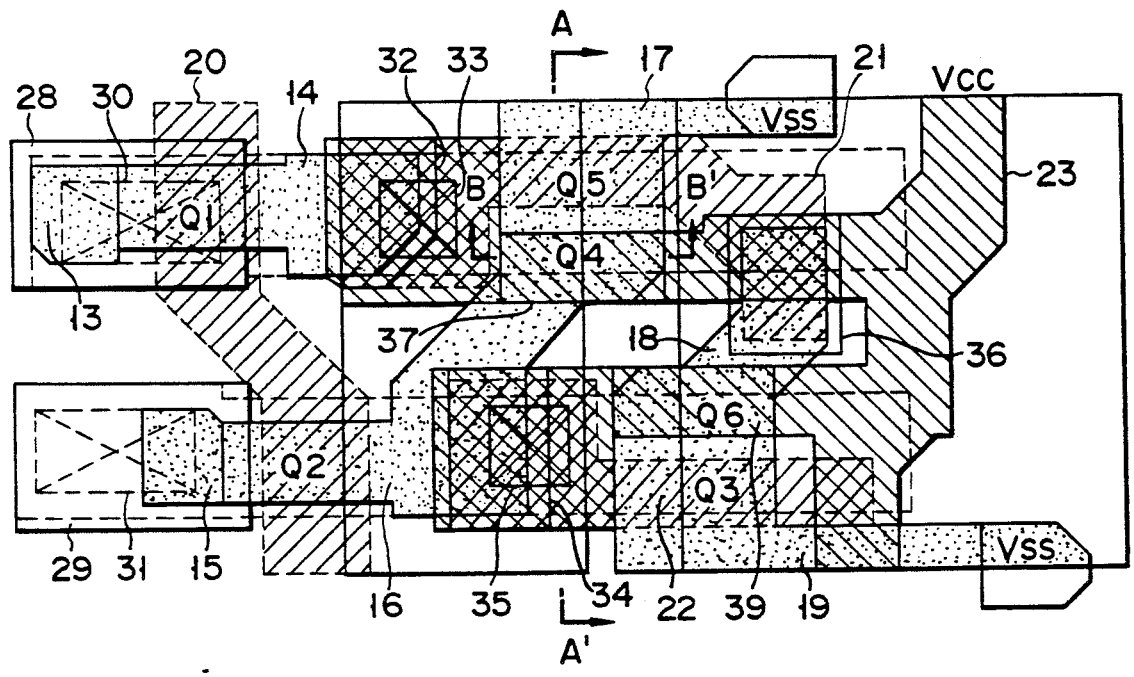
F I G. 4A
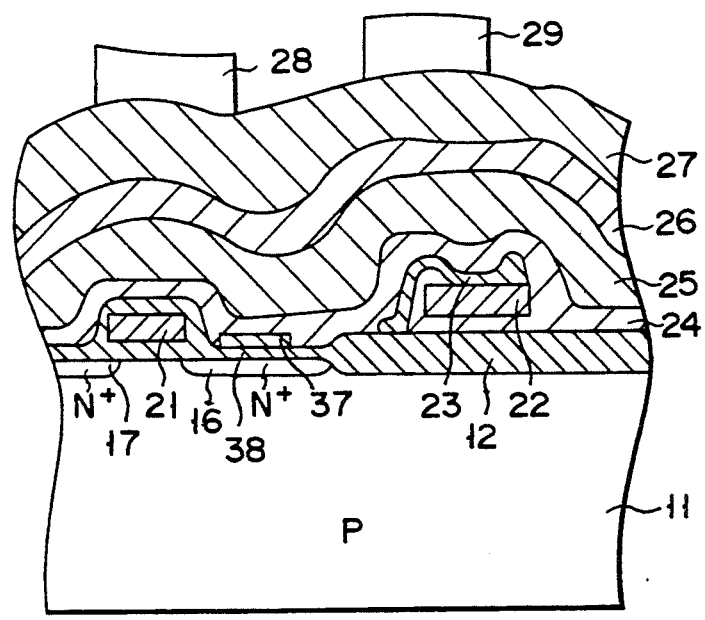
F I G. 4B

STATIC MEMORY

BACKGROUND OF THE INVENTION

1. Field of the Invention

This invention relates to a static memory in which a polysilicon thin film transistor is used as a load element of each memory cell.

2. Description of the Related Art

Recently, a static memory (SRAM), which has polysilicon thin film transistors (hereinafter abbreviated as TFTs) in place of high-resistance load elements constituted by a polysilicon layer, has been developed. The SRAM memory cell having a TFT is located between a complete CMOS memory cell and a memory cell having a high-resistance load element made of a polysilicon layer. Hence, this is a memory cell of the next generation having the advantages of both types of the memory cell. More particularly, the SRAM memory cell can be integrated as high as the latter, and consumes as low power in the static state and operates stably as the former.

The equivalent circuit of the SRAM memory cell having TFTs is shown in FIG. 1. One ends of transfer gates Q1 and Q2 are respectively connected to bit lines BL and $\overline{BL}$, and the other ends thereof, to memory nodes A and B, respectively. The gates of the transfer gates are connected to a word line WL. The drains of an n-channel MOS transistor Q3 and a p-channel TFT Q4 are connected to a memory node A. The gates of transistors Q3 and Q4 are connected to a memory node B. The source of the transistor Q3 is connected to the earth potential $V_{SS}$, and the source of the transistor Q4 to the source potential $V_{CC}$. Similarly, the drains of an n-channel MOS transistor Q5 and a p-channel TFT Q6 are connected to the memory node B. The gates of the transistors Q5 and Q6 are connected to the node A. The source of the transistor Q5 is connected to the earth potential $V_{SS}$, and the source of the transistor Q6 to the source potential $V_{CC}$.

In the above-described memory cell, the transistors Q3 and Q4, and the transistors Q5 and Q6 respectively constitute complementary MOS inverters. The TFT is used as a load element for each of these complementary MOS inverters. Since the TFT serves as a transistor, when the TFT is in an OFF state, substantially no current flows in the memory cell, and when the TFT is in an ON state, a current flows which is much larger than in the case where the conventional high resistance load element is used in the memory cell.

There are two types among the SRAM memory cells having TFTs as load elements. The first type is shown in FIGS. 2A and 2B and the second type is shown in FIGS. 3A and 3B.

FIG. 2A is a pattern plan view showing a structure of the memory cell and FIG. 2B is a cross sectional view taken along line B—B' of FIG. 2A. As these figures show, the SRAM cell comprises a p-type semiconductor region 51; a field insulating film 52; an n+ diffusion region 53 serving as a source or drain region of the n-channel MOS transistor; a first polysilicon layer 54 serving as the gate electrode of the n-channel MOS transistor and the gate electrode of the p-channel TFT gate electrode; a second thin polysilicon layer 55 serving as a channel region and source and drain regions of the p-channel TFT; a channel region 56 of the TFT formed in the second polysilicon layer 55, to which substantially impurity concentration is low; a silicide layer 57 serving as an earth wiring; a silicide layer 58 serving as a main word line; an aluminum layer 59 serving as a first bit line BL; and an aluminum layer 60 serving as a second bit line $\overline{BL}$.

In the above-described structure, as shown in FIGS. 2A and 2B, the channel of the n-channel MOS transistor extends in the same direction as that of the TFT. In other words, the channel regions of the n-channel MOS transistor and the TFT extend horizontally (FIG. 2A). In the TFT, since the channel, source and drain region are formed above the gate electrode, the source and drain regions cannot be self-aligned with the gate electrode, unlike in an ordinary MOS transistor in which the channel, source and drain regions are formed below the gate electrode. In particular, in manufacturing the TFT, it is impossible to use the gate electrode as a mask for forming a channel region, when ions are injected to form source and drain regions. For this reason, the channel length of a TFT must be longer and accordingly the memory size is larger than in an n-channel MOS transistor in which the source and drain regions can be formed in a self-aligning manner. To solve this drawback, offsets can be provided in the memory cell as shown in FIGS. 2A and 2B. However, this method is disadvantageous because the allowance for alignment is small, resulting in difference in the characteristic of the TFTs. Therefore, the method is not of practical use to manufacture an SRAM memory cell.

FIG. 3A is a pattern plan view showing a structure of the memory cell and FIG. 3B is a cross sectional view taken along the line C—C' of FIG. 3A. As is illustrated in FIGS. 3A and 3B, this SRAM memory cell comprises a p-type semiconductor region 71; a field insulating film 72; an n+-diffusion region 73 (not shown in FIG. 3A) serving as a source or drain region of the n-channel MOS transistor; a first polysilicon layer 74 serving as a gate electrode of the n-channel MOS transistor; a second polysilicon layer 75 serving as a gate electrode of a p-channel TFT; a third thin polysilicon layer 76 serving as a channel region and source and drain regions of the p-channel TFT; and a channel region 77 of the TFT formed in the third polysilicon layer 76, in which substantially impurity concentration is low and which is kept at a high resistance. The first polysilicon layer is used as both a word line WL and an earth wiring, and the third polysilicon layer is used as a wiring for conducting the source potential $V_{CC}$. The n+-diffusion region is not shown in FIG. 3A.

In the above-described structure, in addition to the gate electrode 74 of the n-channel MOS transistor, the gate electrode 75 of the TFT is formed above the n-channel MOS transistor. The third thin polysilicon layer 76 serving as the channel region and the source and drain regions of the TFT are formed thereon. The structure is similar to that of FIGS. 2A and 2B in that the TFT cannot be formed in a self-aligning manner. However, it is different in that the channel of the TFT extends perpendicularly to that of the n-channel MOS transistor, as is clearly shown in FIGS. 3A and 3B. In other words, the channel of the n-channel MOS transistor extends perpendicularly to the plane of FIG. 3B, whereas the channel of the TFT extends horizontally. For this reason, the channel length of the TFT can be sufficiently long regardless of the channel length of the n-channel MOS transistor, thus overcoming the drawback due to the small alignment allowance.

However, as is shown in FIG. 3B, the structure is very complicated because of the three polysilicon layers. Moreover, one memory cell has seven contact holes to connect the polysilicon layers to one another, in addition to the contact holes connecting each of the polysilicon layers to the bit lines and the word lines. Further, the gate oxide film of the TFT must be formed of an interlayer film accumulated on the polysilicon layer. The accumulated film is inferior to a thermal oxide film in terms of the characteristics such as the number of pin holes, the Withstanding voltage, and the uniformity. Also, it is difficult to form the film thin.

The conventional SRAM memory cell shown in FIG. 2 has the following drawbacks: (1) the channel length of the TFT, which is not a self-aligning element, cannot be sufficiently long; (2) it is difficult to form a uniform TFT; and (3) since the interlayer accumulating film formed between the polysilicon layers is used as a gate oxide film of the TFT, it is difficult to form the accumulating film thin.

The conventional SRAM memory cell shown in FIG. 3 has the following drawbacks: (1) a complicated manufacturing technique is required to form the memory cell because of the three-layers polysilicon structure; (2) seven contact holes are required for interconnection in the memory cell; and (3) since the interlayer accumulating film formed between the polysilicon layers is used as a gate oxide film of the TFT, it is difficult to form the accumulating film thin.

SUMMARY OF THE INVENTION

This invention has been made in consideration of the above drawbacks of the prior art, and its object is to provide a static memory, in which uniform TFTs having good characteristic are formed, a gate oxide film of the TFT can be thin, with a simple manufacturing technique.

The static memory of this invention is characterized in that a polysilicon thin film transistor is used as a load element in a memory cell, and the gate electrode of the polysilicon thin film transistor is constituted by a diffusion region.

The static memory of this invention comprises a first memory node; a second memory node; a first driving MOS transistor of a first channel type having a drain diffusion region connected to the first memory node, a source diffusion region connected to the reference potential, and a gate electrode connected to the second memory node; a second driving MOS transistor of the first channel type having a drain diffusion region connected to the second memory node, a source diffusion region connected to the reference potential, and a gate electrode connected to the first memory node; a third transistor of a second channel type constituted by a polysilicon thin film transistor in which the drain diffusion region of the second MOS transistor is used as a gate electrode, and which has a source diffusion region connected to the reference potential and a drain diffusion region connected to the first memory node; and a fourth transistor of the second channel type constituted by a polysilicon thin film transistor in which the drain diffusion region of the first MOS transistor is used as a gate electrode, and which has a source diffusion region connected to the reference potential and a drain diffusion region connected to the second memory node.

According to the present invention, since the gate electrodes of the polysilicon thin film transistor is formed of diffusion regions, the structure of the memory cell, which has two polysilicon layers, is similar to the conventional static memory having high-resistant load elements made of polysilicon layers. As a result, the process of manufacturing the memory of this invention is compatible with that of the conventional memory.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4A is a pattern plan view showing a structure of the memory cell used in a static memory of the present invention;

FIG. 4B is a cross sectional view taken along the line A—A' shown in FIG. 4A;

DETAILED DESCRIPTION OF THE PREFERRED EMBODIMENTS

There will now be described an embodiment of this invention with reference to the accompanying drawings.

Figure 1:
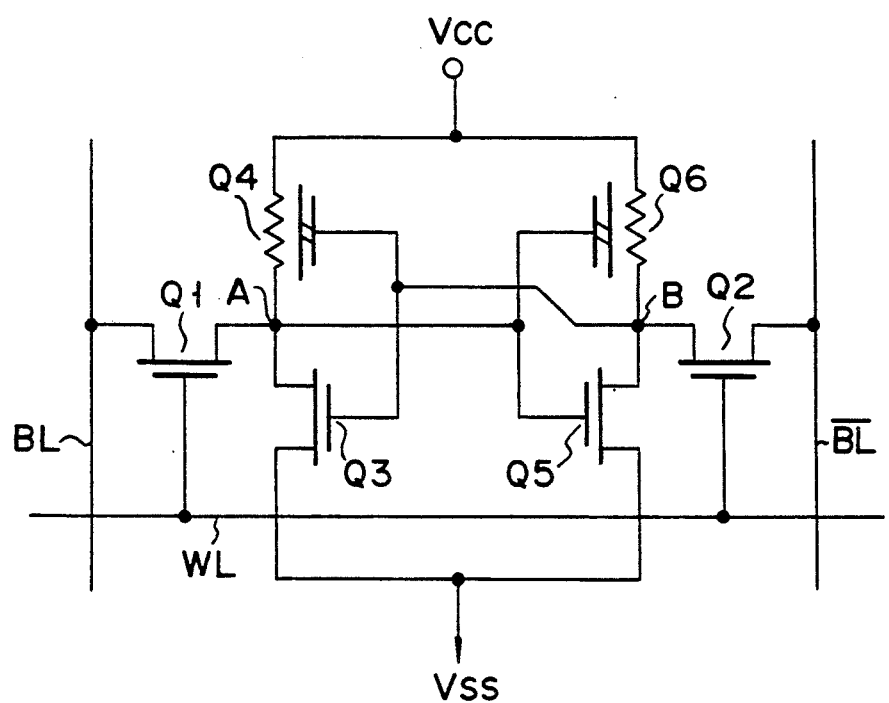
FIG. 1 is a circuit diagram showing an equivalent circuit of a memory cell having TFTs.
Figure 2A:
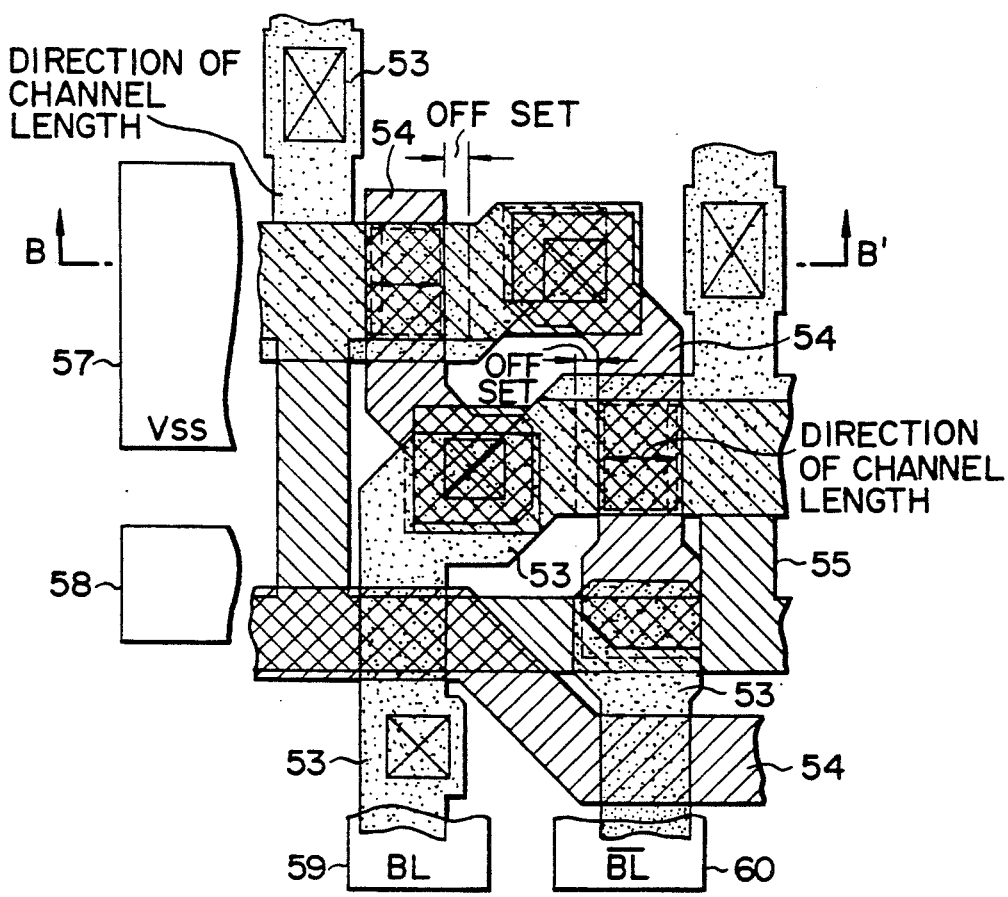
FIG. 2A is a pattern plan view showing a structure of the conventional memory cell.
Figure 2B:
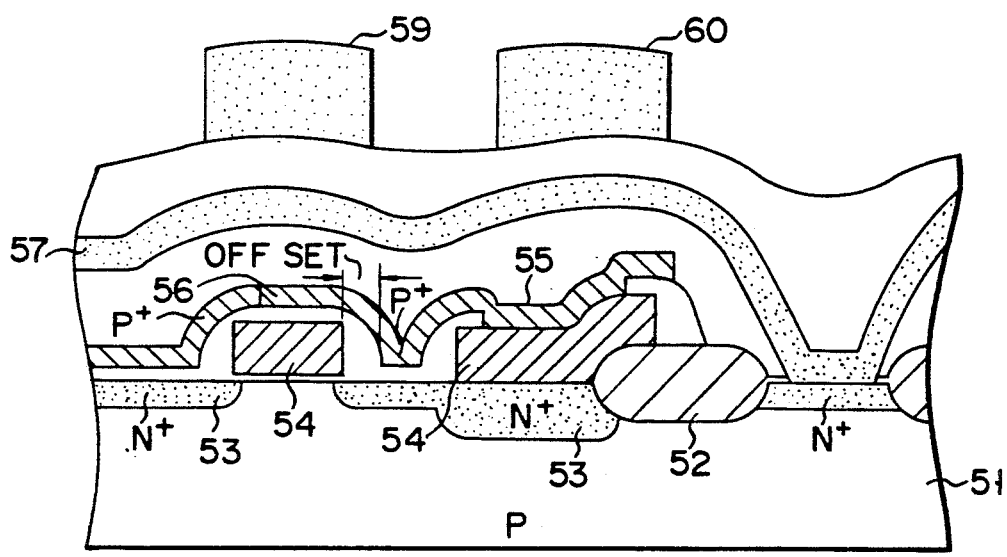
FIG. 2B is a cross sectional view taken along the line B—B' shown in FIG. 2A.
Figure 3A:
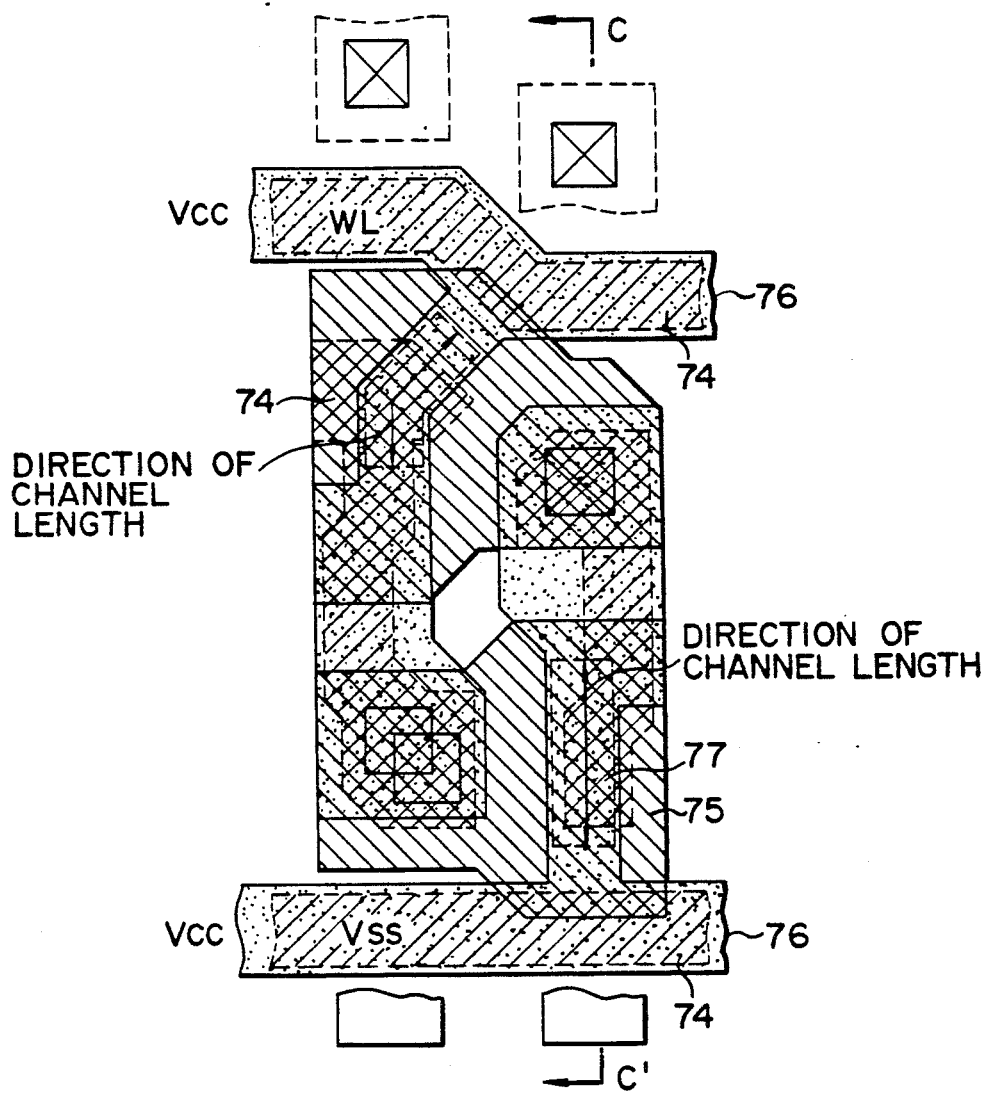
FIG. 3A is a pattern plan view showing a structure of another conventional memory cell.
Figure 3B:
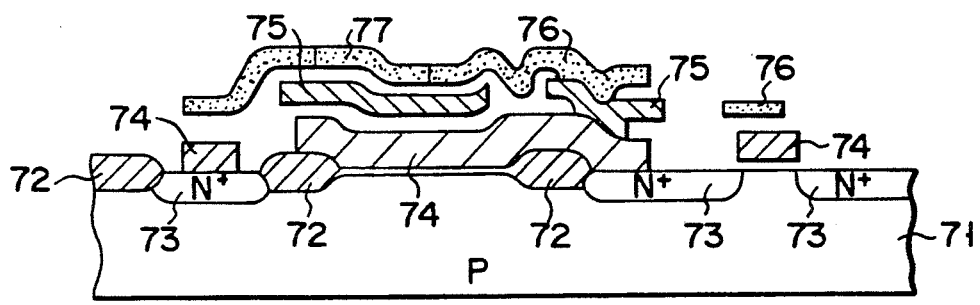
FIG. 3B is a cross sectional view taken along the line C—C' shown in FIG. 3A.
Figure 4C:
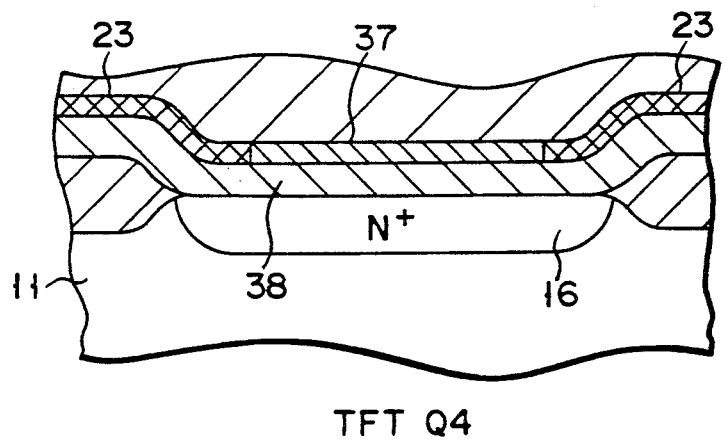
FIG. 4C is a cross sectional view taken along the line B—B' shown in FIG. 4A.
Figure 4D:
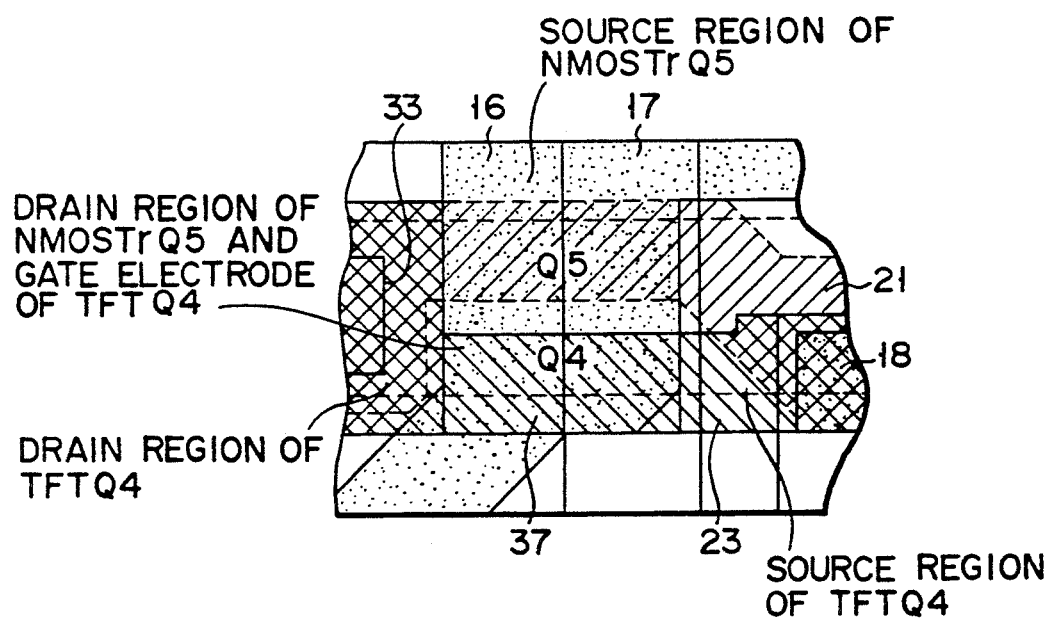
FIG. 4D is an enlarged plan view showing a part of the pattern shown in FIG. 4A.

FIGS. 4A to 4D show an SRAM memory cell used in a static memory according to the present invention. FIG. 4A is a plan view showing a pattern of the memory cell; FIG. 4B is a cross sectional view taken along the line A—A' shown in FIG. 4A; FIG. 4C is a cross sectional view taken along the line B—B' shown in FIG. 4A; and FIG. 4D is an enlarged plan view showing a part of the pattern shown in FIG. 4A. The equivalent circuit of the memory cell is the same as that shown in FIG. 1.

The memory cell shown in FIGS. 4A and 4B comprises a p-type semiconductor region 11; a field insulating film 12; an n+ diffusion region 13 serving as a source or drain region of the n-channel MOS transistor Q1; an n+ diffusion region 14 serving as a drain or source region of the n-channel MOS transistor Q1; an n+ diffusion region 15 serving as a source or drain region of the n-channel MOS transistor Q2; an n+ diffusion region 16 serving as a drain or source region of the n-channel MOS transistor Q2 and also serving as a drain region of the n-channel MOS transistor Q5; an n+ diffusion region 17 serving as a source region of the n-channel MOS transistor Q5; an n+ diffusion region 18 serving as a drain region of the n-channel MOS transistor Q3; an n+ diffusion region 19 serving as a source region of the n-channel MOS transistor Q3; gate electrodes 20 of the n-channel MOS transistors Q1 and Q2 formed of a first polysilicon layer; a gate electrode 21 of the n-channel MOS transistor Q5 formed of the first polysilicon layer; a gate electrode 22 of the n-channel MOS transistor Q3 formed of the first polysilicon layer; a second poysilicon layer 23 of about 200 Å thick, for example; a CVD oxide film 24 formed on the second polysilicon layer 23; a BPSG film 25 formed on the CVD oxide film 24; a CVD oxide film 26 formed on the BPSG film 25; a BPSG film 27 formed on the CVD oxide film 26; and bit lines 28 and 29, made of aluminum film, formed on the BPSG film 27.

The above-mentioned CVD oxide film 24, BPSG film 25, CVD oxide film 26, and BPSG film 27 are accumulated surface protecting films. However, any other surface protecting films can be used in place of these films.

One of the bit lines, 28 is connected to the n+ diffusion region 13 through a contact hole 30, and the other bit line 29 is connected to the n+ diffusion region 15 through a contact hole 31. The n+ diffusion region 14 and the gate electrode 21 of the n-channel MOS transistor Q5 are connected through a contact hole 32, and the gate electrode 21 and the second polysilicon layer 23 are connected through a contact hole 33. The n+ diffusion region 16 and the gate electrode 22 of the n-channel MOS transistor Q3 are connected through a contact hole 34, and the gate electrode 22 and the second polysilicon layer 23 are connected through a contact hole 35. Further, the n+ diffusion region 18 serving as a drain region of the n-channel MOS transistor Q3 and the gate electrode 21 of the n-channel MOS transistor Q5 are connected through a contact hole 36.

P-type impurities are introduced into most part of the second polysilicon layer 23, making the layer low resistive. However, substantially no impurities are introduced into a region 37 of the polysilicon layer 23, which faces the n+ diffusion region 16, maintaining the region 37 high resistive. As shown in FIG. 4C, which is a cross sectional view taken along the line B—B' of FIG. 4A, the region 37 serves as a channel region of the TFT Q4. The region 37 is superimposed on the n+ diffusion region 16 with a thermal oxide film 38 interposed therebetween, which is formed by thermal-oxidizing the n+ diffusion region 16. Similarly, substantially no impurities are introduced into a region 39 of the polysilicon layer 23, which faces the n+ diffusion region 18, thus maintaining the region 39 high resistive. The region 39 serves as a channel region of the TFT Q6, and is superimposed on the n+ diffusion region 18 with a thermal oxide film (not shown) interposed therebetween, which is formed by thermal-oxidizing the n+ diffusion region 18.

In the memory cell thus arranged, the n+ diffusion regions 18 and 16 respectively serving as drain regions of n-channel MOS transistors Q5 and Q3 are also used as the gate electrodes of the TFTs Q4 and Q6. FIG. 4D is an enlarged view showing the TFT Q4 and the n-channel MOS transistor Q5 shown in FIG. 4A. The gate lengths of the TFTs Q4 and Q6 extend perpendicularly to gate lengths of the n-channel MOS transistors Q5 and Q3. More particularly, the gate lengths of the TFTs Q4 and Q6 extend in the horizontal direction, and the gate lengths of the transistors Q5 and Q3 extend in the longitudinal direction in the drawing (FIG. 4A).

As has been described above, the channel regions of the TFT Q4 and Q6 are respectively constituted by the regions 37 and 39 of the polysilicon layer 23, each having a low impurity concentration. In addition, the gate electrodes are constituted by the n+ diffusion regions and face the channel regions with the thermal oxide film interposed therebetween. For this reason, the TFTs Q4 and Q6 cannot be formed in the self-aligning manner. However, the channel length can be determined at a desired value. Thus, the channels of the TFTs Q4 and Q6 can be formed sufficiently long without increasing the size of the memory cell.

Moreover, the gate oxide films of the TFTs Q4 and Q6 are formed of thermal oxidation film superior in characteristic, e.g., the number of pin holes, the withstanding voltage, and the uniformity. Hence, a thin and high quality gate oxide film can be formed without a special technique, and thus the difficulty in the manufacturing process can be overcome. In addition, the memory cell of the above-described embodiment has a two-polysilicon layer structure, which is the same as in the conventional SRAM memory cell of a high-resistant load type. For this reason, the manufacturing process of the memory cell of the invention is similar to that of the conventional SRAM, having high compatibility with the conventional process. Further, the memory cell of the present invention has only five contact holes. Thus, in the memory cell of the above-described embodiment, high quality and uniform TFTs are formed, the gate oxide film of the TFT can be formed thin, not requiring a complicated manufacturing technique.

Additional advantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

What is claimed is:

1. A static memory comprising:
   a semiconductor substrate;
   first and second driving MOS transistors of a first channel conductivity type, each having source and drain regions and a gate electrode, the source and drain regions of said first and second driving MOS transistors being formed in said semiconductor substrate; and
   third and fourth load MOS transistors of a second channel conductively type, each having source and drain regions and a gate electrode, the source and drain regions of said third and fourth load MOS transistors being formed in a polysilicon thin film, the gate electrodes thereof comprising diffusion regions in said semiconductor substrate;
   wherein channel lengths of said first and second driving MOS transistors are substantially perpendicular to channel lengths of said third and fourth load MOS transistors.

2. A static memory comprising:
   first and second memory nodes;
   a first driving MOS transistor of a first channel conductivity type having a drain diffusion region connected to said first memory node, a source diffusion region connected to a first reference potential, and a gate electrode connected to said second memory node;

a second driving MOS transistor of the first channel conductivity type having a drain diffusion region connected to said second memory node, a source diffusion region connected to said first reference potential, and a gate electrode connected to said first memory node;

a third MOS transistor of a second channel conductivity type consisting of a polysilicon thin film transistor having a gate electrode formed of the drain diffusion region of said second drive MOS transistor, a source diffusion region connected to a second reference potential and a drain diffusion region connected to said first memory node, a channel length of said third MOS transistor being substantially perpendicular to a channel length of said second driving MOS transistor; and a fourth MOS transistor of the second channel conductivity type consisting of a polysilicon thin film transistor having a gate electrode formed of the drain diffusion region of said first driving MOS transistor, a source diffusion region connected to said second reference potential and a drain diffusion region connected to said second memory node, a channel length of said fourth MOS transistor being substantially perpendicular to a channel length of said first driving MOS transistor.

3. The static memory according to claim 2, wherein gate insulating films adjacent the gate electrodes of said third and fourth MOS transistors are formed of thermally-grown films formed on said drain diffusion regions of said second and first driving MOS transistors respectively.

4. The static memory according to claim 1 wherein said source and drain regions of said first and second driving MOS transistors comprise diffusion regions formed in said semiconductor substrate, said drain regions of said first and second driving MOS transistors respectively comprising said gate electrodes of said third and fourth load MOS transistors.

* * * * *